United States Patent [19]

Agoston

[11] Patent Number: 4,751,468
[45] Date of Patent: Jun. 14, 1988

[54] TRACKING SAMPLE AND HOLD PHASE DETECTOR

[75] Inventor: Agoston Agoston, Beaverton, Oreg.

[73] Assignee: Tektronix, Inc., Beaverton, Oreg.

[21] Appl. No.: 858,428

[22] Filed: May 1, 1986

[51] Int. Cl.[4] .......................... H03K 9/06; H03K 3/26
[52] U.S. Cl. .................................... 328/133; 328/155;
    328/151; 307/353; 307/511; 307/257; 307/321
[58] Field of Search ...................... 328/133, 155, 151;
    307/352, 353, 511, 257, 321

[56] References Cited

U.S. PATENT DOCUMENTS

| | | | |
|---|---|---|---|
| 3,659,117 | 4/1972 | Caveney et al. | 307/353 |
| 3,737,680 | 6/1973 | Uchida | 307/257 |
| 4,216,396 | 8/1980 | Balaban et al. | 328/151 |
| 4,518,921 | 5/1985 | Logan | 307/353 |

FOREIGN PATENT DOCUMENTS

| | | | |
|---|---|---|---|
| 0156995 | 12/1981 | Japan | 307/353 |
| 0182197 | 10/1983 | Japan | 307/353 |
| 477516 | 12/1976 | U.S.S.R. | 307/511 |

*Primary Examiner*—Stanley D. Miller
*Assistant Examiner*—Timothy P. Callahan
*Attorney, Agent, or Firm*—John Smith-Hill

[57] ABSTRACT

A tracking sample and hold phase detector operating as an error sampled feedback loop which takes signal samples during successive periods of an input signal with a sampling gate, holds the signal sample in a storage gate, and feeds back the sample to the sampling gate to allow the bias of the sampling gate to track the input signal level, thereby maintaining balance of the tracking circuit. A fast comparator detects the zero crossing level of the downconverted signal which is comprised of successive signal sample steps and has the shape of the input signal. The sampling gate comprises a diode bridge enabled by a balanced strobe, the input signal and the strobe being close or equal in frequency, the frequency of the downconverted signal being the difference frequency.

10 Claims, 3 Drawing Sheets

TRACKING SAMPLE AND HOLD PHASE DETECTOR

BACKGROUND OF THE INVENTION

The invention relates to electrical measurement, and more particularly to an improved phase detector circuit in an error sampled feedback loop.

There is a need in a variety of applications such as sampling-enhanced measurement systems and avionics navigation systems for detecting the phase coincidence or measuring the phase difference between two periodic signals having the same or slightly differing frequencies.

D-type master-slave flip-flops are used conventionally in phase detector applications; however, the fastest commercially available D-type flip-flops do not provide time/phase resolution in the picosecond range.

In a fixed bias sampling gate, the sampling efficiency is a nonlinear function of the input signal amplitude. To minimize the effect of the nonlinearity, the sampling gate is operated in an error sampled feedback loop (ESFL) utilizing highly oversampled (considerably greater than f/2) sequential sampling. The ESFL allows a high speed, but otherwise nonlinear and unstable sampling gate to operate as a comparator/null detector, reduces strobe radiation into the signal line, and improves the sampling efficiency.

It is therefore an object of the present invention to provide an improved circuit for detecting the phase coincidence between two periodic signals.

It is another object of the present invention to provide an improved circuit for measuring the phase difference between two periodic signals.

It is another object of the present invention to provide an improved phase detector circuit operating as an error sampled feedback loop.

Another object of the present invention is to provide an improved tracking sample and hold circuit for detecting phase coincidence with high speed and picosecond resolution.

SUMMARY OF THE INVENTION

In accordance with the present invention, a sampling gate of an error sampled feedback loop utilizes highly oversampled sequential sampling wherein a balanced strobe signal having a frequency close to the frequency of an input signal samples the input signal. The input signal samples are held in a storage element and fed back to the sampling gate by way of a biasing network. The bias applied to the sampling gate therefore tracks the input signal. The output of the storage element is a downconverted, stepped signal having the shape of the input signal and a frequency equal to the difference frequency between the input signal and the strobe signal. The steps of the downconverted signal occur synchronously with the strobes. A fast comparator enabled by a delayed strobe detects the zero-crossing level of the down-converted signal.

DRAWING

While the invention is set forth with particularity in the appended claims, other objects, features, the organization and method of operation of the invention will become more apparent, and the invention will best be understood by referring to the following detailed description in conjunction with the accompanying drawing in which:

FIG. 3 is a timing diagram useful in explaining the operation of the circuit of FIG. 2.

DESCRIPTION OF THE PREFERRED EMBODIMENT

Figure 1:
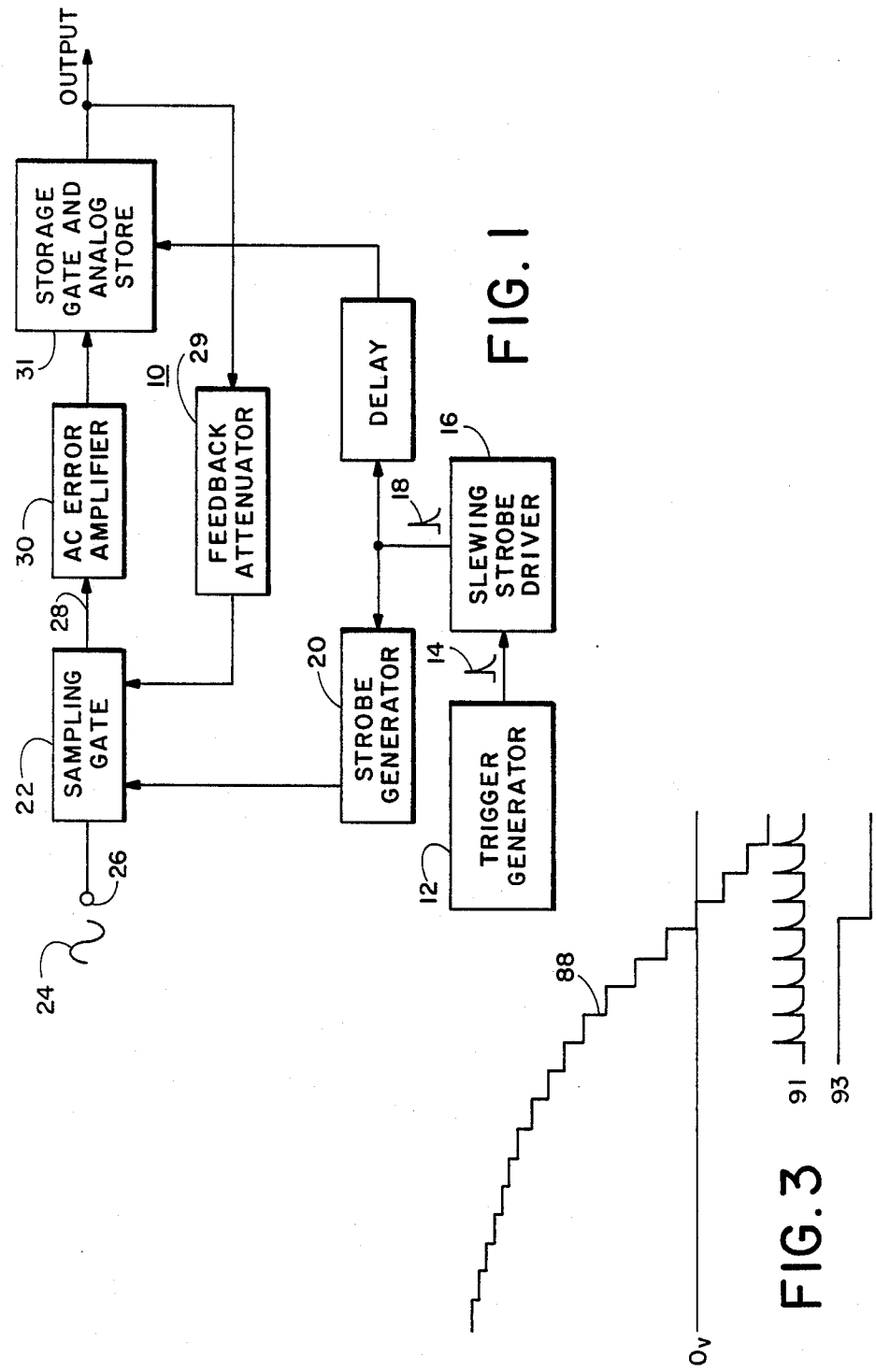
FIG. 1 is a block diagram of a circuit utilizing an error sampled feedback loop.

Referring now to the drawing for a more detailed description of the components, construction, operation and other features of the instant invention by characters of reference, FIG. 1 illustrates the input circuits of a sequential sampling oscilloscope which utilizes an error sampled feedback loop 10. A trigger generator 12 provides a pulse 14 which serves as a starting event for a slewing strobe driver circuit 16. The output of the slewing strobe driver circuit 16 is a strobe drive pulse 18 which is slewed or sequentially delayed with respect to the trigger pulse 14. A strobe generator 20 driven by the slewed strobe drive pulse 18 provides a sampling strobe output to an input sampling gate 22 which samples an input signal 24 applied to an RF input terminal 26. The sampling gate 22 generates an error signal on line 28 which is the difference between the instantaneous value of the input signal 24 and a feedback signal provided to the sampling gate 22 from a feedback attenuator circuit 29. The error signal is amplified in an AC error amplifier 30 and applied to a storage gate and analog store circuit 31. The storage gate conducts in response to a delayed strobe drive pulse, and the error signal is integrated in the analog store during conduction of the storage gate. The output of the analog store, which is the vertical output signal to the oscilloscope, is fed back via the feedback attenuator 29 to the input sampling gate 22, thus completing the error sampled feedback loop 10 wherein the input sampling gate 22 functions as a high speed comparator, and the ESFL performs the function of a tracking sample and hold circuit. Each error sample value stored in the analog store 31 serves as an estimate for the subsequent signal sample. Upon occurrence of the next strobe 18 the input signal 24 is sampled and the cycle is repeated.

Figure 2:
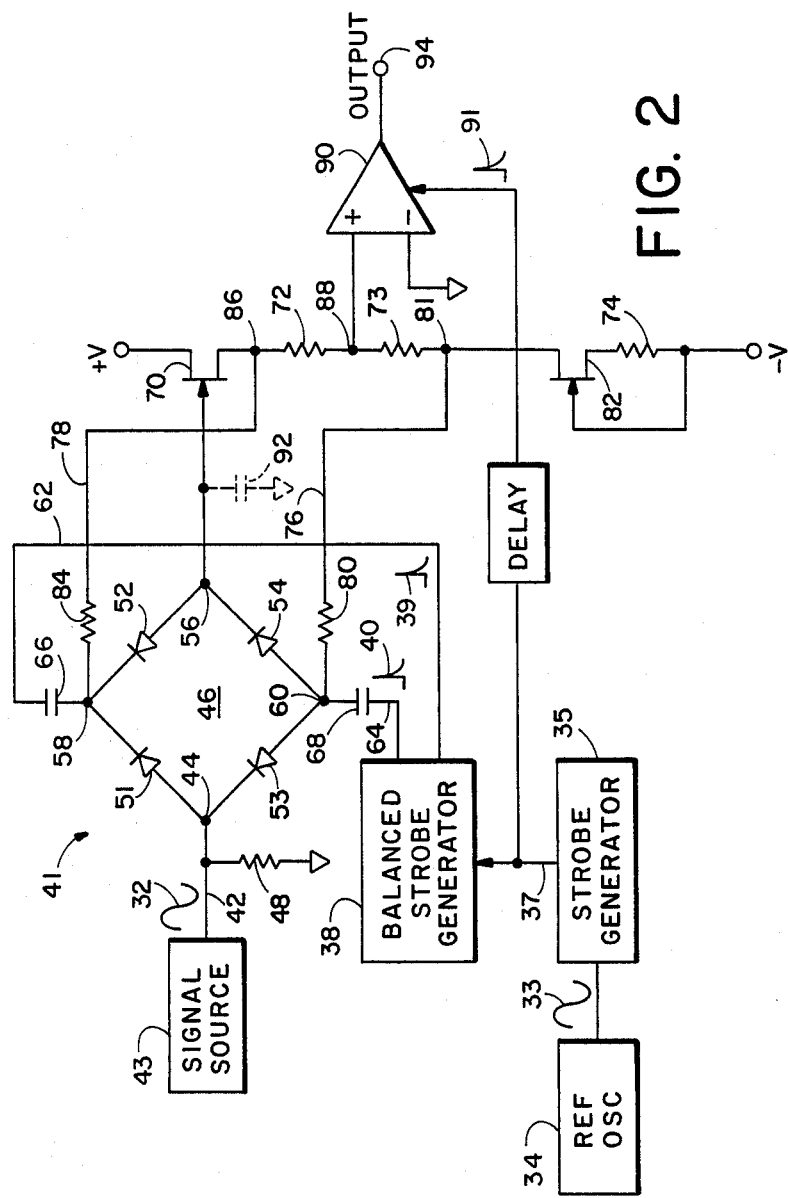
FIG. 2 is a circuit diagram, partially in block form, of a tracking sample and hold phase detector circuit in accordance with the present invention.

Referring now to FIG. 2, a preferred embodiment of the present invention compares an input signal 32 with a reference signal 33 having the same or a slightly differing frequency than the input signal 32. The reference signal 33 is generated in a reference oscillator 34 and provided to a strobe generator circuit 35 which suitably may be a zero-crossing detector or a step recovery diode strobe generator providing a strobe pulse on output lead 37 and having the same frequency as the reference signal 33. A balanced strobe generator 38 transforms the high amplitude (15–20 volts), short (70–100 picoseconds) single ended pulse into a pair of balanced strobe pulses 39, 40. The balanced strobe generator 38 is utilized for the purpose of reducing strobe radiation (kick-out) into the input signal source 43.

A tracking sample-and-hold phase detector circuit 41 receives the input signal 32 via lead 42 from a signal source 43 which may be for example an oscillator or a receiver. The input lead 42 is connected to an input junction 44 of a diode bridge 46, and to ground through an input resistor 48. Four matched hot-carrier diodes 51, 52, 53, 54 are connected in bridge configuration forming a sampling gate between the input junction 44 and an output junction 56. Diode 51 is connected cathode-to-anode between a junction 58 and the input junction 44, and diode 52 is connected cathode-to-anode between junction 58 and the output junction 56. Diode 53 is connected cathode-to-anode between the input junction 44 and a junction 60, and diode 54 is connected cathode-to-anode between the output junction 56 and the junction 60.

The balanced negative and positive sampling strobes 39, 40 are applied, respectively, on leads 62, 64 through capacitors 66, 68 to the junctions 58, 60. The output terminal 56 is connected to the gate of JFET 70 which has a drain connected to a positive voltage source (+V). A bias and feedback network includes equal-valued resistors 72, 73, 74 and leads 76, 78. Negative bias is applied to the junction 60 through a resistor 80 from a junction 81 between the resistor 73 and a JFET 82, which is connected to a source of negative voltage (−V). Positive bias is applied to the junction 58 via the lead 78 through a resistor 84 from a junction 86 between the JFET 70 and resistor 72. The JFETs 70, 82 are dual matched devices on a common substrate, and the resistors 80, 84 are equal value. An output junction 88 of the bias and feedback network is connected to the non-inverting input terminal of a fast strobed comparator 90. The inverting input terminal of the strobed comparator 90 is connected to ground, therefore the circuit 90 functions as a zero-crossing detector. A strobe pulse 91, slightly delayed from the time of strobes 39, 40, is applied to the comparator circuit 90 as an enabling input, on the rising edge of the strobe pulse. The comparator 90 output is gated by the falling edge of the strobe pulse 91. The fast strobed comparator 90 is a model SP 9685 circuit manufactured by Plessey, Ltd. and procured in chip form.

The input signal 32 is sampled once each period by the sampling strobes 39, 40. During the interval between strobes, the diodes 51, 52 are reverse biased by the positive potential on the junction 86, and the diodes 53, 54 are reverse biased by the negative potential on junction 81, consequently, the diode bridge forms a very high impedance block between the junctions 44, 56. Upon occurrence of the strobes 39, 40, the diodes 51–54 are momentarily forward biased and the diode bridge presents a low impedance path for the input signal 32 between the junctions 44, 56, and a voltage level proportional to the instantaneous value of the input signal 32 is applied to the gate of JFET 70 charging gate capacitance 92. The balanced strobes 39, 40 are sufficiently wide—at least three times the RC time constant of the circuit comprising the source input impedance, the input resistor 48, the diode bridge 46 and the capacitance 92—to allow the capacitance 92 to charge substantially to the level of the input signal sample. The JFET 70, operating as a voltage follower, impresses the level of the input signal sample on the junction 88 of the bias and feedback network, establishing the new reference level about which bias for the sampling gate 46 is established. Between strobes, when the gate of JFET 70 is virtually floating, the voltage level of the input signal is stored in the gate capacitance 92 of JFET 70, and coupled from the balanced bias and feedback network via the feedback paths 76, 78, respectively, to capacitors 68, 66 for the next sample of the input signal. The bias at junctions 81, 86 of the balanced bias network is developed with respect to the reference level at the junction 88, and thus follows or tracks the level of the input signal as determined in the sampling gate 46 and stored in capacitance 92.

As successive strobes 39, 40 are generated, a down-converted signal (see FIG. 3) having a frequency $|f_d|$, where $f_d = f_i - f_r$, and $f_i$ is the frequency of the input signal 32, $f_r$ is the frequency of the reference signal and $f_d$ is the difference frequency between the input signal 32 and the reference signal 33, is generated on junction 88 and input to the fast comparator 90. The comparator 90, operating as a zero-crossing detector, generates an output signal 93 on terminal 94 when the downconverted signal 88 reaches zero volts, indicating that the input and reference signals are in phase.

Figure 4:
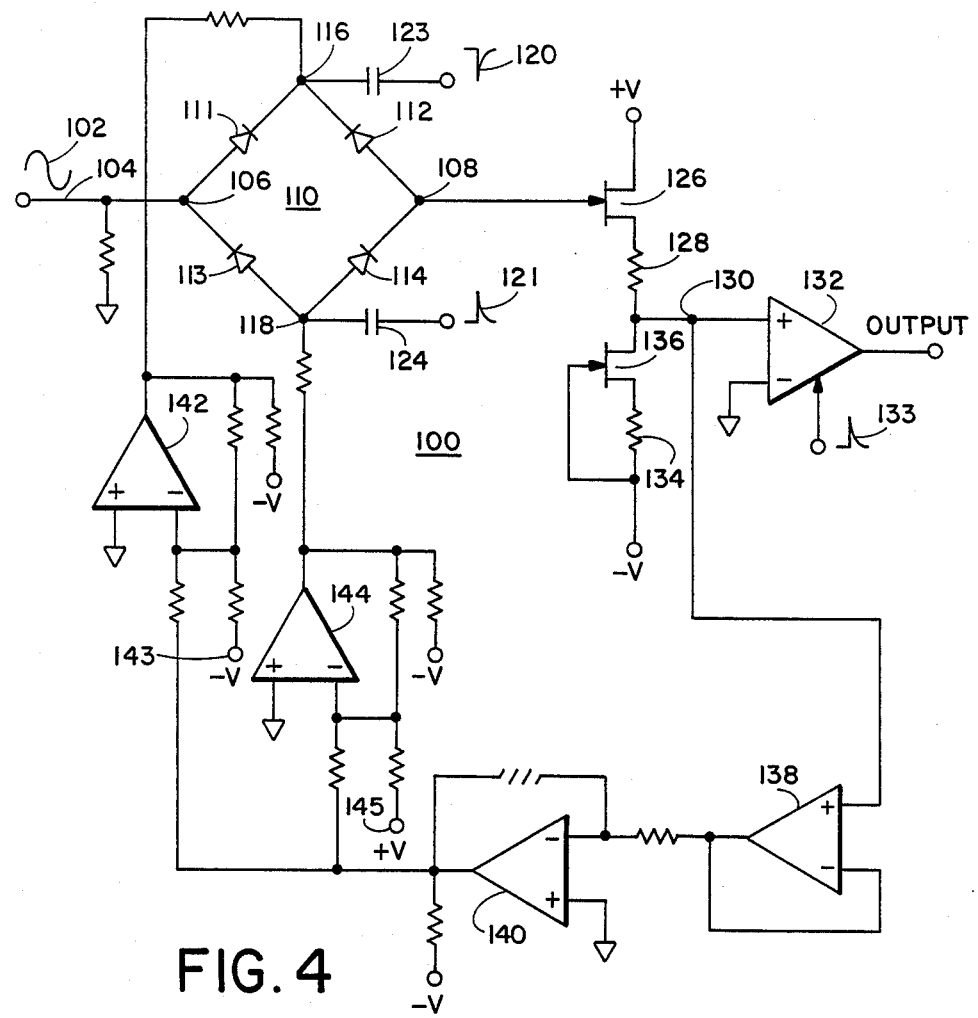
FIG. 4 is a circuit diagram of an alternative embodiment of the invention.

Referring now to FIG. 4, an alternative embodiment of a tracking sample and hold phase detector circuit 100 is shown. The circuit 100 receives the input signal 102 via lead 104 which is connected to an input junction 106 of a diode bridge 110. Four matched diodes 111, 112, 113, 114 are connected in bridge configuration between the input junction 106 and an output junction 108. Diode 111 is connected cathode-to-anode between a junction 116 and the input junction 106, and diode 112 is connected cathode-to-anode between junction 116 and the output junction 108. Diode 113 is connected cathode-to-anode between the input junction 106 and a junction 118, and diode 114 is connected cathode-to-anode between the output junction 108 and the junction 118. The diode bridge 110 forms a sampling gate having signal input and output terminals 106, 108, and strobe input terminals 116, 118.

Balanced negative and positive sampling strobes 120, 121 are applied, respectively, through capacitors 123, 124 to the junctions 116, 118. The output terminal 108 is connected to the gate of JFET 126 which has a drain connected to a source of positive voltage (+V), and an output connected through a resistor 128 to a junction 130 at the noninverting input of a fast strobed comparator 132. The inverting input terminal of the strobed comparator 132 is connected to ground, therefore the circuit 132 functions as a zero-crossing detector. A strobe pulse 133, slightly delayed from the time of strobes 120, 121, is applied to the comparator circuit 132 as an enabling input, on the rising edge of the strobe pulse. The comparator 132 output is gated by the falling edge of the strobe pulse 133. The strobe 133 is delayed 1–1.5 nanoseconds to allow settling time for signal perturbations caused by strobing the sampling gate and for delay through JFET 126. A source of negative voltage (−V) is connected through resistor 134 and JFET 136 to the junction 130. A voltage follower network comprised of JFETs 126, 136 and equal-value resistors 128, 134 is matched to provide zero level shift from the junction 108 to the junction 130.

A bias and feedback network includes a voltage follower circuit 138 and an inverting amplifier 140 providing feedback input to biasing amplifiers 142, 144, the amplifier 142 having negative voltage applied to a terminal 143 and providing reverse bias for the diodes 111, 112 at the input terminal 116 of the sampling gate, and the amplifier 144 having positive voltage applied to a terminal 145 and providing reverse bias for the diodes 113, 114 at the input terminal 118 of the sampling gate.

The tracking sample and hold phase detector circuit 100 of FIG. 4 operates like the circuit previously described with reference to FIG. 2 except that the use of amplifiers in the feedback circuit allows the open loop gain to be unity which yields a faster transient response.

During the occurrence of the balanced strobe pulses, the voltage change at the gate of JFET 126 is proportional to, but only a small fraction of the sample-to-sample increment of the input signal 102. The response of the feedback loop to that small voltage change following each high speed strobe is such that the gate of JFET 126 charges to the actual value of the input signal.

While the principles of the invention have now been made clear in the foregoing illustrative embodiment, there will be immediately obvious to those skilled in the art many modifications of structure, arrangement, proportions, the elements, material and components used in the practice of the invention, and otherwise, which are particularly adapted for specific environments and operating requirements without departing from those principles. The appended claims are, therefore, intended to cover and embrace any such modifications, within the limits only of the true spirit and scope of the invention.

I claim:

1. A phase detector circuit, comprising:
    means responsive to a first periodic signal for generating a sample of a second periodic signal once during each successive period of said first periodic signal, said first and second periodic signals having substantially the same frequency;
    circuit means connected to said sample generating means and including means for storing a level of said sample of said second periodic signal, said circuit means including means for disabling said sample generating means between successive samples, said disabling means including means responsive to said stored level of said sample for establishing a reference level provided to said sample generating means at which reference level said sample generating means operates for a next successive sample; and
    means coupled to said circuit means for detecting a predetermined level of said sample of said second periodic signal stored in said storing means, said circuit means providing an input signal to said detecting means comprising successive ones of said level of said second periodic signal, said input signal having a frequency which is the difference between the frequencies of said first and said second periodic signals, whereby an output of said detecting means provides an indication of phase relationship between said first and second periodic signals.

2. A tracking sample and hold phase comparator, comprising:
    a source of periodic reference pulses;
    a diode bridge sampling gate having
        an input terminal receiving a first periodic signal having a frequency substantially the same as that of said periodic references pulses,
        first and second control input terminals receiving said periodic reference pulses and a bias voltage, and
        an output terminal, said diode bridge sampling gate being disabled by said bias voltage applied to said control input terminals and enabled by said periodic reference pulses to generate a sample of said first periodic signal on said output terminal;
    circuit means connected to said output terminal and including means for holding said sample of said first periodic signal, said circuit means including bias means for generating said bias voltage applied to said control input terminals, whereby said bias voltage tracks a level of said sample held in said circuit means; and
    a level detector circuit coupled to said circuit means and receiving an input therefrom representing the level of said sample, said level detector circuit being responsive to said source of periodic reference pulses to generate an output signal when said sample of said first periodic signal is a predetermined level, whereby an output of said detecting means provides an indication of phase coincidence between said first periodic signal and said reference pulses.

3. Circuit means for detecting phase coincidence between a first periodic signal and a reference periodic signal, comprising:
    means responsive to said reference periodic signal for generating a sample of said first periodic signal during successive periods of said reference periodic signal, said first periodic signal and said reference periodic signal having substantially the same frequency, said sample generating means being disabled between said samples by a bias voltage;
    circuit means connected to said sampling means and including means for storing said sample of said first periodic signal, said circuit means including means for generating said bias voltage said bias voltage generating means including means for tracking a voltage level of said sample stored in said storing means; and
    means coupled to said circuit means for detecting a predetermined level of said sample of said first periodic signal, said circuit means providing an input signal to said detecting means comprising successive ones of said voltage level of said sample stored in said storing means, said input signal having a frequency which is the difference between the frequencies of said first periodic signal and said reference periodic signal, whereby an output of said detecting means provides an indication of phase relationship between said first periodic signal and said reference periodic signals.

4. A phase detector circuit, comprising:
    a diode bridge circuit receiving first and second periodic signals and being responsive to said first periodic signal for generating a sample of said second periodic signal once during each successive period of said first periodic signal, said first and said second periodic signals having substantially the same frequency;
    circuit means connected to said diode bridge circuit and including means coupled to an output of said diode bridge circuit for storing a level of said sample of said second periodic signal, said circuit means including means for disabling said diode bridge circuit between successive samples, said disabling means including means responsive to said stored level of said sample for establishing a reference level provided to said diode bridge circuit at which reference level said diode bridge circuit operates for a next successive sample; and
    means coupled to said circuit means for detecting a predetermined level of said sample of said second periodic signal stored in said storing means, said circuit means providing an input signal to said detecting means comprising successive ones of said level of said second periodic signal, said input signal having a frequency which is the difference between the frequencies of said first and said second periodic signals, whereby an output of said detecting means provides an indication of phase relationship between said first and second periodic signals.

5. The phase detector of claim 4 wherein said first periodic signal comprises a pair of balanced strobe pulses applied to said diode bridge circuit to forward bias said diode bridge.

6. The phase detector of claim 5 wherein said disabling means comprises means for reverse biasing said diode bridge.

7. A tracking sample and hold phase comparator, comprising:
   a source of periodic reference pulses comprising balanced strobes;
   a diode bridge sampling gate having
      an input terminal receiving a first periodic signal having a frequency substantially the same as that of said periodic references pulses,
      first and second control input terminals receiving said balanced strobes and a bias voltage, and
      an output terminal, said diode bridge sampling gate being disabled by said bias voltage applied to said control input terminals and enabled by said balanced strobes to generate a sample of said first periodic signal on said output terminal;
   circuit means connected to said output terminal and including means for holding said sample of said first periodic signal, said circuit means including bias means for generating said bias voltage applied to said control input terminals, whereby said bias voltage tracks a level of said sample held in said circuit means; and
   a level detector circuit coupled to said circuit means and receiving an input therefrom representing the level of said sample, said level detector circuit being responsive to said source of periodic reference pulses to generate an output signal when said sample of said first periodic signal is as predetermined level, whereby an output of said detecting means provides an indication of phase coincidence between said first periodic signal and said reference pulses.

8. Circuit means for detecting phase coincidence between a first periodic signal and a reference periodic signal, comprising:
   a diode bridge circuit receiving said reference periodic signal and responsive thereto to generate a sample of said first periodic signal during succesive periods of said reference periodic signal, said first periodic signal and said reference periodic signal having substantially the same frequency, said diode bridge circuit being disabled between said samples by a bias voltage;
   circuit means connected to said diode bridge circuit and including means for storing said sample of said first periodic signal, said circuit means including means for generating said bias voltage, said bias voltage generating means including means for tracking a voltage level of said sample stored in said storing means; and
   means coupled to said circuit means for detecting a predetermined level of said sample of said first periodic signal, said circuit means providing an input signal to said detecting means comprising successive ones of said voltage level of said sample stored in said storing means, said input signal having a frequency which is the difference between the frequencies of said first periodic signal and said reference periodic signal, whereby an output of said detecting means provides an indication of phase relationship between said first periodic signal and said reference periodic signal.

9. The circuit means of claim 8 wherein said reference periodic signal comprises a pair of balanced strobes applied to said diode bridge circuit to forward bias said diode bridge circuit.

10. The circuit means for claim 9 wherein said bias voltage generating means includes means for applying reverse bias to said diode bridge, said reverse bias being referenced to said voltage level of said sample stored in said storing means.

* * * * *